United States Patent [19]

Cook et al.

[11] 4,450,461

[45] May 22, 1984

[54] LOW COST HIGH ISOLATION VOLTAGE OPTOCOUPLER WITH IMPROVED LIGHT TRANSMISSIVITY

[75] Inventors: James S. Cook, Tully, N.Y.; J. Anthony Lennon, Newry, Northern Ireland

[73] Assignee: General Electric Company, Syracuse, N.Y.

[21] Appl. No.: 286,628

[22] Filed: Jul. 24, 1981

[51] Int. Cl.³ .................... H01L 33/00; H01L 31/12; H01L 23/26; G02B 5/14
[52] U.S. Cl. ........................ 357/19; 357/17; 357/72; 357/75; 350/96.15
[58] Field of Search .............. 357/19, 72, 80, 75, 357/17; 350/96.15

[56] References Cited

U.S. PATENT DOCUMENTS

| | | | |
|---|---|---|---|
| 4,010,483 | 3/1977 | Liu | 357/17 |
| 4,095,116 | 6/1978 | Felkel et al. | 357/19 X |
| 4,114,177 | 9/1978 | King | 357/75 |
| 4,271,365 | 6/1981 | Adams | 357/19 X |
| 4,368,481 | 1/1983 | Ohashi et al. | 357/19 X |

*Primary Examiner*—Andrew J. James
*Assistant Examiner*—J. L. Badgett
*Attorney, Agent, or Firm*—Robert J. Mooney

[57] ABSTRACT

A high isolation voltage optocoupler includes spaced apart emitter and detector elements coupled to one and the other ends of a bar of light transmissive dielectric material. A reflective coating on the surface of the bar enhances light coupling. An opaque dielectric housing excludes ambient light and provides mechanical support for the coupling elements.

1 Claim, 9 Drawing Figures

LOW COST HIGH ISOLATION VOLTAGE OPTOCOUPLER WITH IMPROVED LIGHT TRANSMISSIVITY

This invention relates in general to semiconductor devices and more particularly to a low cost semiconductor optocoupler having improved coupling between the emitter and detector thereof while maintaining high dielectric strength therebetween.

The use of optocouplers in a wide variety of electrical circuit applications is pervasive. Optocouplers, which provide an electrically isolated link between two circuits through the use of an optical emitter and an optical detector which may be operated at vastly different electrical potentials, are employed in power supplies, telecommunications, computer interfacing, control systems, and a wide variety of other applications. While devices of unquestioned utility presently exist for a number of these applications, the use of optocouplers in other applications has thus far been prohibited by a cost-performance tradeoff. While high performance optocouplers have been obtainable, their cost has been likewise high. Low cost couplers while available have been of likewise low performance.

A significant characteristic of an optocoupler is the isolation voltage, the voltage which can be sustained between the input and output terminals without breakdown. Another important characteristic is the degree of optical coupling between the input and output of the device which is sometimes referred to as the current transfer ratio (CTR) or similar specification. The isolation voltage of optocouplers may be quite readily increased by increasing the spacing between the emitter and detector elements of the coupler since for most materials the dielectric strength increases directly with increased thickness of material. The spacing between the emitter and detector cannot however be increased without limit due inter alia to package constraints and perhaps even more significantly to the reduction in CTR which accompanies a wider spacing of emitter and detector elements.

A number of approaches have been used to increase breakdown voltage while at the same time maintaining high CTR. A very successful approach has been the introduction of a layer of glass between the emitter and detector. Glass has a higher dielectric strength than many materials and a relatively thin glass sheet dispossed between the emitter and detector elements provides great dielectric strength and therefore high isolation voltages. Such a construction however is expensive to manufacture and while it provides high performance, both in terms of CTR and isolation voltage, it is not universally applicable due to its relatively high cost. Another approach which has been successful involves the use of a so-called light cavity wherein a clear curable dielectric medium is interposed between the emitter and detector elements in an uncured state and then cured during subsequent manufacture. A reflective dielectric medium is formed around the clear medium to cause internal reflection and increase the CTR. While such a structure has provided relatively good performance, both in terms of CTR and breakdown voltage, the breakdown voltage has not been as high as is sometimes required and therefore this design as well is not universally applicable to all couplers. Additionally, the requirements of certain testing agencies, notably Verband Deutscher Elektrotecniker (VDE), a European testing organization similar to Underwriters Laboratories, requires that optocouplers, in order to receive approval for certain applications, have a minimum spacing of 2 millimeters between the emitter and detector elements thereof. The optocoupler structures heretofore described have not been capable of providing acceptable CTR over such a wide spacing.

A need presently exists for an optocoupler combining wide spacing between the emitter and detector elements thereof; high efficiency coupling between such emitter and detector elements and low cost for the widest possible application of such a coupler.

Accordingly it is an object of this invention to provide an optocoupler having an emitter and detector element widely spaced therein for achieving a high dielectric strength therebetween and high breakdown voltage while at the same time providing heretofore unachieved efficiency of coupling and therefore high CTR between the emitter and detector elements.

It is another object of this invention to provide such a coupler in an easy to manufacture form which can be produced at low cost.

Briefly stated and in accordance with one aspect of this invention an optocoupler having high isolation voltage and high CTR which is manufactured at low cost includes an optical emitter and an optical detector responsive to light generated by the emitter in response to an electrical input signal thereto. The emitter and detector are respectively coupled to one and another ends of a bar of light transmissive material by intermediate layers of light transmissive coupling material. The transmission of light through the bar of light transmissive material is enhanced in accordance with a preferred embodiment of this invention by the presence of a reflective dielectric coating on the bar which causes the light to be substantially contained within the bar of light transmissive material and therefore to be conducted with great efficiency from the emitter to the detector. An opaque dielectric housing such as epoxy or silicone molding compound is provided for both eliminating the effects of ambient light on the operation of the optocoupler and for providing mechanical support for the electrical leads thereof.

In accordance with an alternative embodiment of this invention the bar of light transmissive dielectric material may have a shape selected to further improve the coupling between the emitter and detector and the one and another ends of the bar.

The invention also includes a method for manufacturing an optocoupler in accordance with the teachings thereof which method is particularly low in cost. According to the method of this invention a lead frame which preferably includes the input leads and output leads of the optocoupler is provided onto which lead frame the emitter and detector pellets are mounted and to the several pins of which lead frame the various electrical connections from the emitter and detector pellets are made. The emitter and detector pellets are coated with a coupling layer of clear light transmissive dielectric material and the light transmissive bar is positioned between the pellets in contact with the coupling layer. The light transmissive material is then preferably cured to provide both a support for the bar and efficient coupling to the ends thereof from the emitter and detector elements. In accordance with a preferred embodiment of the invention a layer of reflective dielectric material is then applied to the bar as well as to the coupling layers to enhance the transfer of light from the emitter to the detector. The reflective dielectric material is preferably a curable material which is applied in an uncured form and then cured. A suitable housing for the device may be formed by encapsulating the device in epoxy or in silicone molding compound or the like.

Features of the invention which are believed to be novel are pointed out with particularity in the appended claims. The invention itself however, both as to its organization and method of operation together with further objects and advantages thereof may best be understood by reference to the following description taken in conjunction with the accompanying drawing in which:

Figure 1:
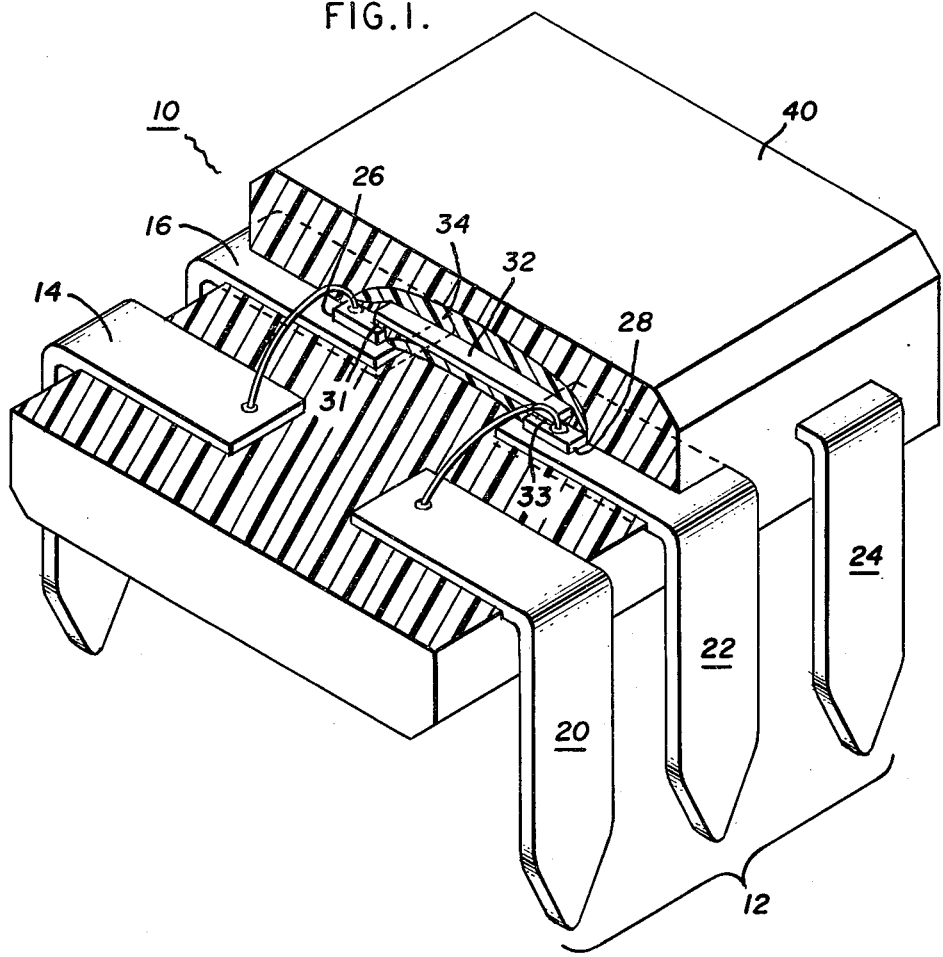
FIG. 1 is a cut-away view of an optocoupler in accordance to this invention.
Figure 2:
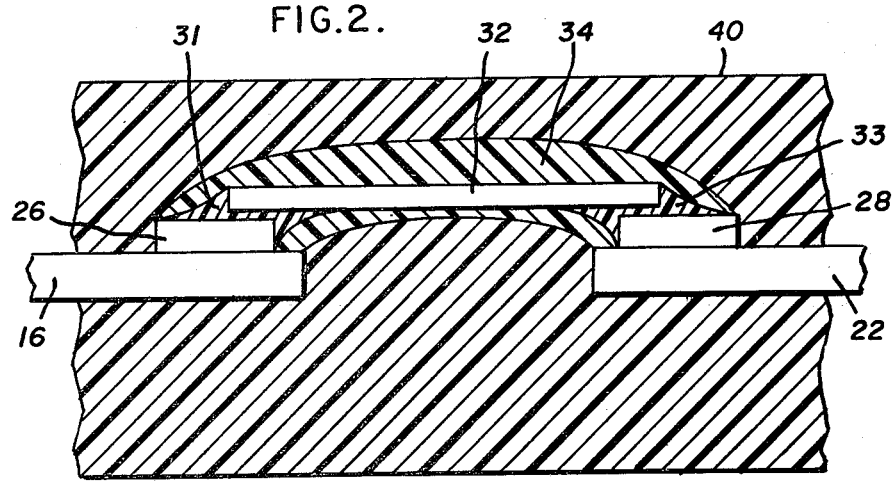
FIG. 2 is a fragmentary enlarged sectional view of the coupler of FIG. 1.

Referring now to FIGS. 1 and 2 an optocoupler 10 in accordance with this invention is illustrated which includes first and second opposed sets of spaced apart terminals one set being shown at 12. Each set may include a number of individual terminals within that set such as terminals 20, 22 and 24 of set 12, and terminals 14, 16 of the other set. The device of FIGS. 1 and 2 will be recognized as taking the form of the so-called dual-in-line package conventionally employed for a wide variety of semiconductor devices. The terminals are conveniently provided during manufacture of the device of FIG. 1 in the form of a lead frame having the individual terminals supported therein by a detachable web of connecting material which is removed after certain fabrication steps employed in manufacturing the device are completed. Typically, the electrical terminals remain connected in the lead frame during the mounting of the semiconductor elements thereon and, where desired, through the encapsulation of the device in its outer protective housing after which encapsulation the connecting material may be removed, the terminals being supported by the body of housing material.

The use of the dual-in-line package for housing optocouplers of the type to which this invention is addressed is per se known and it is only the combination thereof with the other features of this invention which provides the unique and heretofore unobtained advantages of this invention. An emitter 26 and a detector 28 are mounted on terminals 16 and 22, respectively. It is preferred in accordance with this invention that emitter 26 be a semiconductor light emitting diode which is responsive to an electrical input signal to generate a light output signal which light output signal may be a visible light output signal or an infrared light output signal or any other signal to which detector 28 is responsive. A variety of particular types of light emitting diodes are known such as semiconductor diodes fabricated of Group III-V semiconductor materials such as gallium arsenide or multi-component materials such as gallium aluminum arsenide, gallium aluminum arsenide phosphide and the like. Detector 28 mounted to an upper surface of terminal 22 is selected to be responsive to the light output signal generated by emitter 26 and to produce an electrical output signal. Typically, detector 28 takes the form of a light controlled semiconductor device through whose terminals an electrical output signal flows under control of the light output signal from emitter 26 as detected by detector 28. Thus in accordance with this invention the generation of an electrical output signal should be understood to mean not only the direct generation of an electrical signal but also the control of an external electrical signal. In the past coupling between emitters and detectors has been accomplished through the use of a curable light transmissive dielectric medium disposed therebetween. This approach, often times referred to as the light cavity approach, has been effective in providing low cost optocouplers of reasonable performance but has not provided the maximum electrical isolation between the input and output terminals of the device that is sometimes required. Increased spacing has been effective to increase the isolation voltage of the device but at the expense of reduced efficiency of coupling between the emitter and detector elements.

This invention employs an optically transmissive dielectric rod 32 or bar disposed between emitter 26 and detector 28. Rod 32 may conveniently be manufactured of glass, clear epoxy, plastic, fiber optic waveguide or any other light transmissive material. In form rod 32 may have a number of shapes as will be more fully described hereinbelow but is characterized by a generally elongate form to the ends of which the emitter and detector are coupled as distinguished from a plate of optically transmissive dielectric material as has been heretofore employed in certain coupler constructions wherein the transmission of light has been primarily between faces of the plate through the short thickness dimension thereof rather than along a rod of optically transmissive dielectric coupling material as is shown in FIGS. 1 and 2. Preferably, in order to enhance coupling between emitter 26, detector 28 and the respective ends of rod 32, first and second layers of coupling material 31 and 33 are disposed between the emitter 26, the detector 28 and their respective ends of rod 32. It is preferred in accordance with this invention to employ a clear curable dielectric material such as clear silicone rubber, epoxy or the like for coupling layers 31 and 33.

The efficiency of coupling between the emitter and detector may be greatly enhanced in accordance with this invention by providing on the surface of rod 32 a layer of electrically non-conductive optically reflective material 34 for enhancing the transmission of light from the emitter through rod 32 to the detector. Layer 34 may preferably take the form of a curable resilient material such as silicone rubber, a reflective epoxy or the like any of which can conveniently be applied to the surface of rod 32 and which may if desired surround all or part of emitter 26, detector 28 and the optically transmissive coupling layers between the emitter and detector and the respective ends of rod 32. Reflective layer 34 is preferably chosen for its dielectric strength in addition to its reflective characteristics inasmuch as it bridges the gap between input electrical terminal 16 and output terminal 22 and could if of insufficient dielectric strength, provide a breakdown path therebetween. Still further, reflective layer 34 is chosen for its integrity of bonding both to dielectric rod 32 and coupling layers 31 and 33. It will be appreciated that the interfaces between the various elements which make up this invention especially those interfaces which intersect both the input and output terminals, provide a possible path for electrical breakdown therealong.

A body 40 of non-conductive opaque material surrounds the heretofore described elements of the invention. Body 40 may be formed of a material selected for its electrically insulative optically opaque characteristics such as epoxy, silicone molding compound and other similar materials. Typically housing 40 is formed by molding or the like. The particular materials and methods for forming housing 40 are well known and no particular deviations from prior art methods for forming such housings need be made except to insure that the interface between housing 40 and the outer surface of reflective material 34 is of sufficient dielectric strength to insure that breakdown does not occur therealong. The techniques described by U.S. Pat. No. 4,271,365 are advantageously employed herein.

Referring specifically now to FIG. 2 a cross-sectional view of a portion of the device illustrated at FIG. 1 is shown for the purpose of more clearly illustrating the precise construction of rod 32 and the placement thereof with respect to emitter 26 and detector 28 as well as the application of reflective layer 34 thereto. FIG. 2 includes the innermost portions of leads 16 and 22, emitter pellet 26, detector pellet 28, rod 32a and reflective layer 34. Omitted from FIG. 2 are the end portions of leads 16 and 22 as well as encapsulating housing 40. Emitter 26 and detector 28 are attached to leads 16 and 22 respectively in a conventional manner such as by soldering, welding, attachment by an alloy layer, a conductive adhesive, or the like. It will be understood that electrical contact to emitter 26 and detector 28 may conveniently be made to one terminal thereof by a low resistance connection between an electrode on the lower surface of the emitter and detector pellets respectively and to further terminals of the emitter and detector by means of leads connected between electrodes on the upper surface of the devices and electrical terminals 14, 18, 20 and 24.

Optical coupling between emitter 26 and rod 34 is enhanced through the use of coupling layer 31 disposed between the emitter pellet and the end of rod 34. Layer 31 may conveniently be clear silicone such as Dow Corning 6101 or 3140. It is preferred that coupling layer 31 be applied and only partially cured prior to the application of reflective layer 34. Similarly, coupling layer 33 enhances the transfer of optical energy from bar 32a to detector 28. Layer 33 is conveniently formed of the same material as layer 31. In accordance with this invention it is preferable to apply coupling layers 31 and 33 to the emitter and detector pellets respectively in liquid or semi-liquid flowable form and then to place rod 32 in contact therewith and held thereby afterwhich the assembly is heated to an elevated temperature to partially cure layers 31 and 33 and to anchor rod 32 in a position thereon. After such partial curing reflective layer 34 is applied over rod 32 as well as over coupling layers 31 and 33 and portions of emitter 36 and detector 28. After the application of reflective layer 34, preferably in liquid form, layer 34 is cured by heating to an elevated temperature which heating step simultaneously completes the curing of layers 31 and 33 and therefore insures a high breakdown voltage interface therebetween. Non-conductive reflective coating 34 is preferably a layer of silicone with a reflective material such as titanium dioxide mixed therewith. Layer 34 must be selected to adhere to bar 32 as well as to coupling layers 31 and 33. It has been found that a mixture of about 5 to 1 by weight of silicone rubber with titanium dioxide provides a reflective coating which substantially increases the efficiency of coupling between emitter 26 and detector 28. In accordance with the embodiment of the invention illustrated at FIG. 2, rod 32 may conveniently take a cylindrical or rectangular cross-sectional form, the ends of which are disposed on emitter 26 and detector 28 in proximity to light generating and light sensitive regions thereof respectively.

Figure 3:
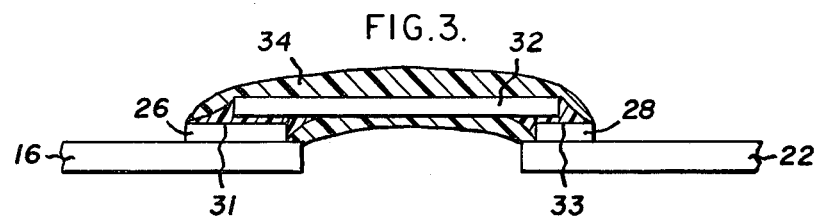
FIGS. 3 through 9 are detailed sectional views of alternative embodiments of the invention.
Figure 7:
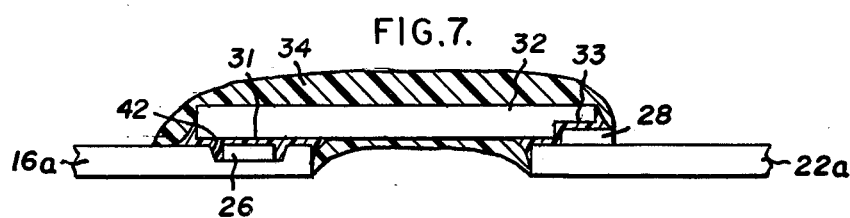
Figure 8:
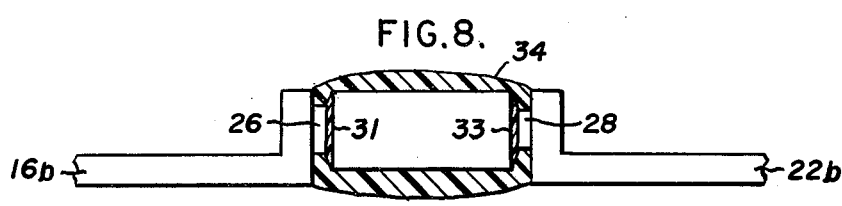
Figure 9:
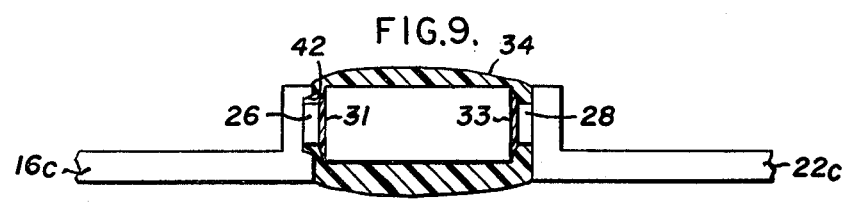

While the invention as thus far described provides a number of significant advantages over the prior art, particularly in the area of achieving higher isolation voltages between the input and the output terminals, further modifications and changes therein may be utilized to provide further advantages, particularly as to the efficiency of light coupling between the emitter and detector devices. A number of structures illustrative of such modifications and changes are illustrated in FIGS. 3 through 9 wherein detailed views of that portion of the structure of this invention hereinabove illustrated at FIG. 2 are depicted. Where common elements are included in the several views, like reference numerals are utilized to indicate such elements. For example, terminals 16 and 22 of FIGS. 3 through 6 are substantially identical in form to terminals 16 and 22 of FIGS. 1 and 2. Terminals 16a, 16b and 16c, as well as terminals 22a, 22b and 22c of FIGS. 7 through 9, are slight variations of the terminals illustrated in FIGS. 1 through 6. For reference, FIG. 3 shows essentially the same structure of device as illustrated in FIGS. 1 and 2.

Figure 4:
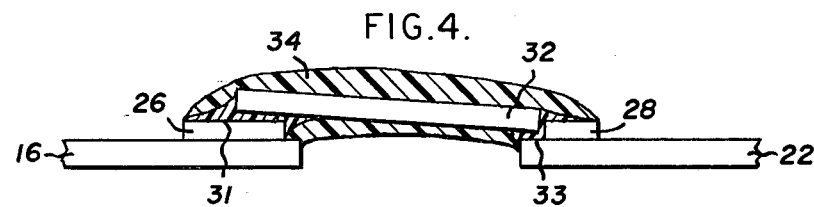

In certain instances it may be desirable to enhance the coupling to the emitter pellet 28 by, for example, disposing one end of rod 32 adjacent the edge of pellet 28 rather than the upper surface thereof. In some cases substantially more light is emitted from the edge of a plane junction pellet than from the upper surface and by disposing the end of rod 32 adjacent the edge enhanced coupling may be obtained. Such a structure is illustrated in FIG. 4 where it will be further observed that light output from the upper surface of emitter 28 is nevertheless coupled to rod 32 by coupling layer 33 which preferably extends partially or completely over the upper surface of pellet 28. While FIG. 4 illustrates a coupling arrangement to detector pellet 26 which is oriented toward a light sensitive area on the upper surface thereof, it will be understood that where a detector pellet having higher sensitivity for light impinging on an edge junction thereof is employed, the structure of FIG. 4 may be further modified by disposing rod 32 and pellet 26 in the same relationship as illustrated for the opposite end of rod 32 and emitter 28.

Figure 5:
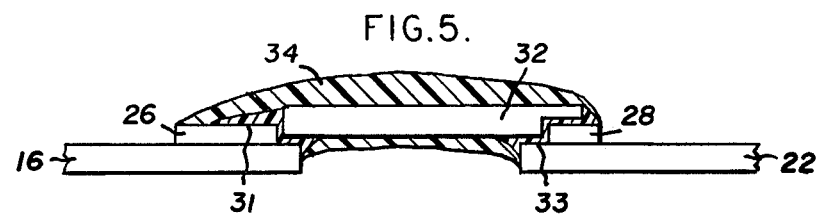
Figure 6:
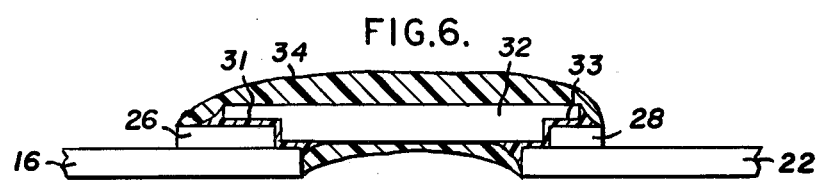

In accordance with the embodiment of this invention illustrated at FIGS. 5 and 6, one or both ends of rod 32 may be appropriately notched or otherwise contoured in order to provide enhanced coupling to both the side and upper surfaces of one or both of emitter 28 and detector 31.

It is an additional advantage of the structure of FIGS. 5 and 6 that enhanced positional stability between rods 32 and the emitter and detector pellets during the assembly of the device is provided by the notches. Longitudinal stability is provided by the notches themselves which restrict displacement of the rod and additionally by the increased contact area between the rod, coupling layer 31 and 33 and their respective emitter and detector pellets due to the contoured rod ends. It will be understood that the particular embodiments of the invention illustrated for example at FIGS. 5 and 6 do not attempt to depict each and every possible configuration that the invention may take which includes one or more contoured end portions in a rod coupling an emitter and detector pellet. For example, it may be desirable to provide a notch at the detector end and not the emitter end which configuration is not illustrated. Further, the particular configuration of notch may well be matched to the shape of the pellet in order to further enhance the efficiency of light coupling between the pellet and the rod.

A further structural approach for increasing the efficiency of coupling between either the emitter or detector and the light transmissive rod is illustrated in an exemplary embodiment of this invention shown at FIG. 7. A recess 40 is provided in terminal 16 for receiving pellet 26. Preferably recess 40 may be formed by coining lead 16 or by other methods for forming such a recess as may be well known to those skilled in the art. It is preferred that recess 42 be of a shape which maximizes the efficiency of light coupling between the pellet and the end of rod 32 and recess 42 may be coated with a reflection enhancing coating such as tin. While not illustrated, it will be appreciated that a recessed area may be provided in either or both of leads 16 and 22 depending on the particular configuration of pellets employed for the emitter and detector functions. It will be further appreciated that while a rectangular recess has been illustrated in each case, corresponding to rectangular shaped pellets as are illustrated herein, that where pellets having different shapes are employed the shape of the recess may be changed in order to match the shape of the pellet.

Coupling efficiency between the emitter and detector pellets and respective ends of the light transmissive rod may be further enhanced at a slight increase in complexity by disposing the pellets on terminals 16b and 22b as illustrated in FIG. 8 wherein the most closely adjacent ends of the two terminals are bent in order to provide mounting surfaces thereon which face each other to which surfaces the emitter and detector pellets are attached as heretofore described. Coupling layers 31 and 33 are disposed on the facing surfaces of the detector and emitter pellets respectively and rod 32 is disposed therebetween in a manner substantially identical to that heretofore described except that the rod does not rest on the pellets but is rather supported therebetween. While not illustrated, it will be appreciated that reflective coating 34 is also preferably utilized in the embodiment of FIGS. 8 and 9 to enhance the transfer of light from the emitter to the detector. As illustrated in FIG. 9 the features of FIG. 8 may be combined with those of FIGS. 3 through 7 to provide a structure as illustrated in FIG. 9. A recess 40 is provided in one of the upstanding pellet receiving portions of leads 16c or 22c so as to receive, for example, pellet 26 therein. Further, a notch or the like may be provided as illustrated at the opposite end to improve the coupling to, for example, emitter 28.

While the invention has been described in connection with certain presently preferred embodiments thereof, it will be apparent to those skilled in the arts that certain modifications and changes may be made therein without departing from the true spirit and scope of the invention. Accordingly, the invention is intended to be limited solely by the appended claims.

What is claimed is:

1. A semiconductor optocoupler comprising
an electrically insulative supporting substrate on which is situated first and second finger-like terminals having inner ends confronting each other in spaced relation across an expanse of said substrate,
an emitter responsive to an electrical input signal to generate a light output signal and mounted on one of said terminals adjacent its inner end;
 a detector responsive to said light output signal to generate an electrical output signal and mounted on the other of said terminals adjacent its inner end, said detector being spaced apart from said emitter by at least the spacing of the inner ends of said terminals to provide electrical isolation therebetween;
 a rod-shaped optically transmissive dielectrical member of glass having a transverse sectional area approximately that of said emitter and detector and having a flat bottom face at one end mounted on and supported by said emitter and in light receiving relation with said emitter, said rod-shaped member having a flat bottom face at its other end mounted on and supported by said detector and in light transmitting relation with said detector, said rod-shaped member spanning the gap across said substrate between the emitter and detector and being operative to optically couple light from said emitter to said detector while maintaining electrical isolation therebetween;
 a first layer of optically transmissive coupling material disposed between said emitter and said one end of said rod-shaped member and operative to enhance the coupling of said light output signal from said emitter to said one end, and a second layer of optically transmissive coupling material disposed between said detector and the other end of said rod-shaped member and operative to enhance the coupling of said light output signal from said other end to said detector;
 a reflective layer of electrically non-conductive optically reflective material bonded to and covering substantially all of the surface of said rod-shaped member;
 a body of electrically non-conductive opaque material enclosing said rod-shaped member and emitter and detector;
 the outer ends of said respective terminals extending from said body and providing external electrical connections for said emitter and detector.

* * * * *